United States Patent [19]

Klein et al.

[11] 4,413,401

[45] Nov. 8, 1983

[54] METHOD FOR MAKING A SEMICONDUCTOR CAPACITOR

[75] Inventors: Thomas Klein; Andrew G. Varadi; Charles E. Boettcher, all of Saratoga, Calif.

[73] Assignee: National Semiconductor Corporation, Santa Clara, Calif.

[21] Appl. No.: 280,984

[22] Filed: Jul. 6, 1981

Related U.S. Application Data

[60] Division of Ser. No. 59,637, Jul. 23, 1979, Pat. No. 4,290,186, which is a continuation of Ser. No. 788,872, Apr. 19, 1977, abandoned.

[51] Int. Cl.³ .................... B01J 17/00; H01L 21/265
[52] U.S. Cl. .................................. 29/571; 29/576 B; 29/577 C; 29/578; 148/1.5; 357/23; 357/59
[58] Field of Search ............. 148/1.5; 29/571, 576 B, 29/576 C, 577 C, 578; 357/23 C, 51, 59

[56] References Cited

U.S. PATENT DOCUMENTS 3,408,543 10/1968 Ono et al. ..................... 357/23 C
3,740,731 6/1973 Ohwada et al. ............... 357/23 C
3,740,732 6/1973 Frandon ........................... 357/23

OTHER PUBLICATIONS

Tasch Jr. et al., *IEEE Trans. on Electron Devices*, vol. Ed. 23, No. 2, Feb., '76, pp. 126–131.

*Primary Examiner*—M. J. Andrews
*Attorney, Agent, or Firm*—Gail W. Woodward; Paul J. Winters; Michael J. Pollock

[57] ABSTRACT

This disclosure is directed to an improved semiconductor capacitor structure especially useful in an integrated semiconductor structure with an MOS device and fabrication methods therefor. This semiconductor capacitor is particularly useful for forming the capacitor portion of a single MOS memory cell structure in a dynamic MOS random access memory which utilizes one MOS device in combination with a capacitor. In one specific disclosure embodiment, the semiconductor capacitor comprises a boron (P) implanted region in a substrate of P- type conductivity followed by a shallow arsenic (N) implant into the boron implanted region. The boron implanted region provides a P type conductivity which has a higher concentration of P type impurities than the concentration of impurities contained in the substrate which is of P- type conductivity. Thus, the boron implanted region performs the important function of preventing a surface N type inversion layer from being formed across the semiconductor surface beneath the silicon dioxide insulating layer which could occur across the substrate P- surface if the arsenic implant region was made into the P- substrate without the P type boron implant. The arsenic implant is of N type conductivity and has a higher concentration of impurities than the boron implant region. The dielectric portion of the semiconductor capacitor is the portion of the silicon dioxide layer located on the surface of the arsenic implanted region. A doped polysilicon electrode is formed over this portion of the silicon dioxide insulating layer and provides the other plate of the capacitor structure. In another embodiment that is disclosed, this above described semiconductor capacitor structure or device is combined with an MOS device in a single integrated semiconductor structure in order to provide a single MOS memory cell for dynamic random access memory chip utilizing the MOS device and the capacitor. Preferably, the semiconductor capacitor is shown as a connected extension of either the source or drain region of the MOS device.

12 Claims, 4 Drawing Figures

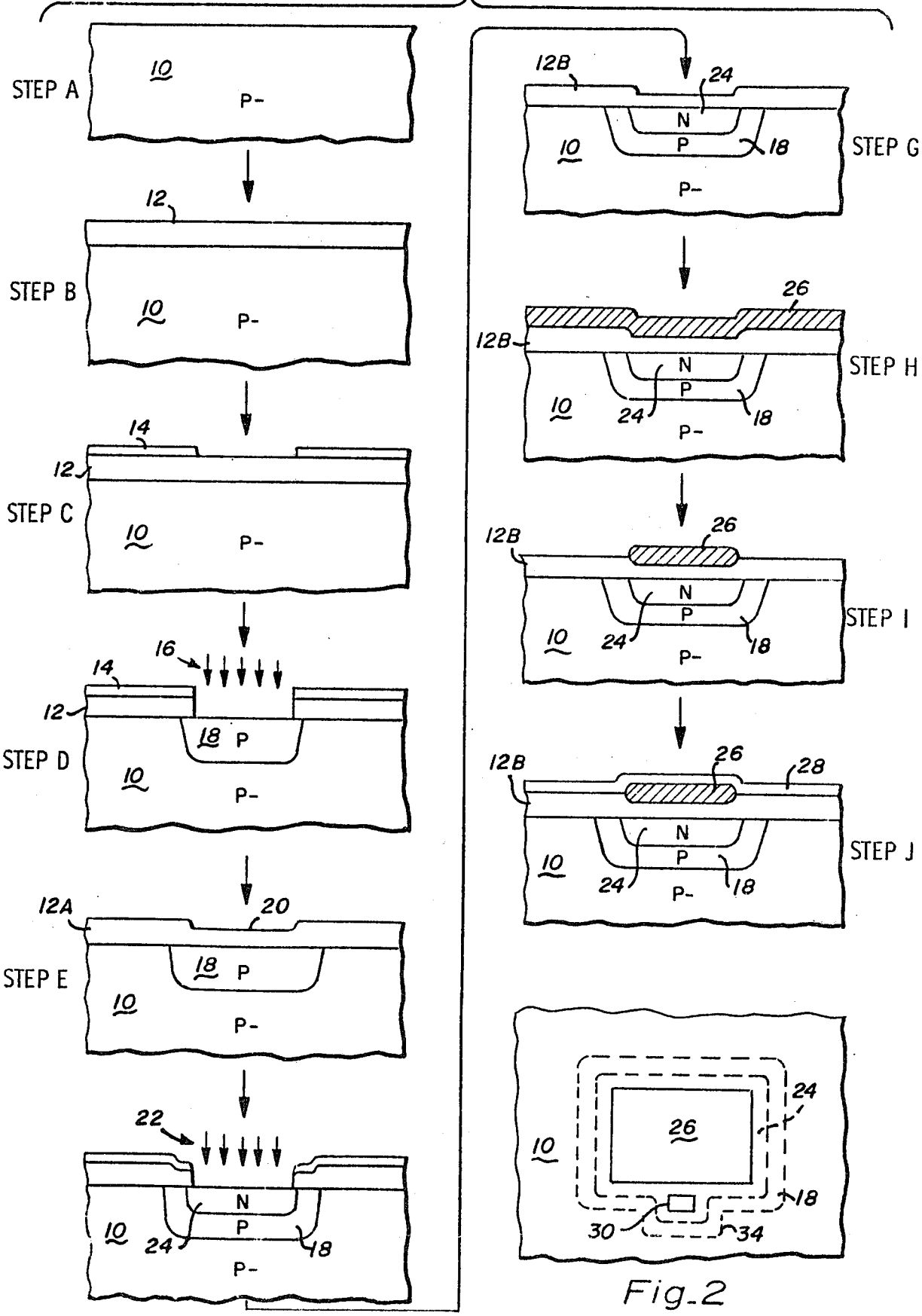

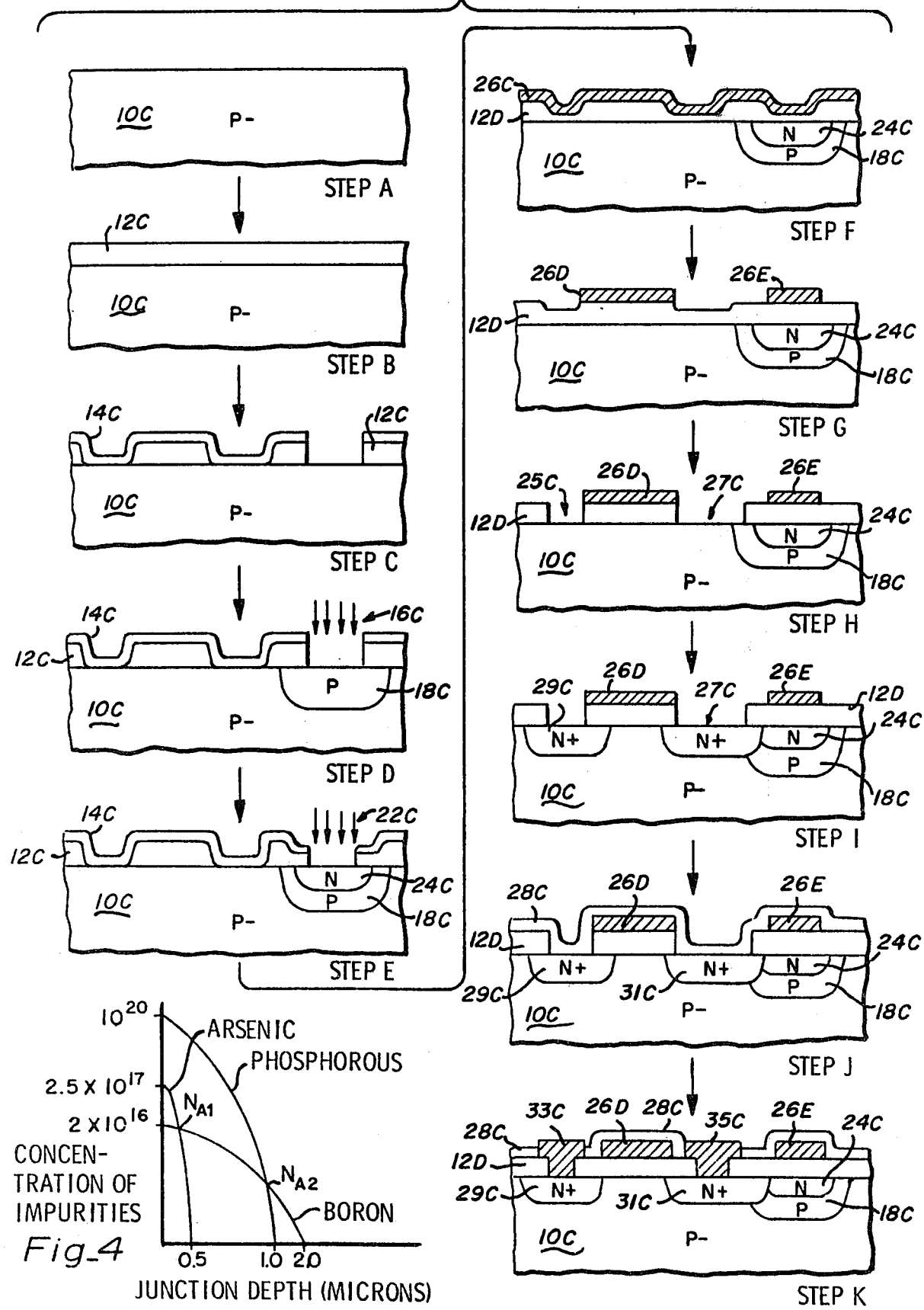

METHOD FOR MAKING A SEMICONDUCTOR CAPACITOR

This application is a division of application Ser. No. 059,637 filed July 23, 1979, now U.S. Pat. No. 4,290,186 which in turn is a continuation of application Ser. No. 788,872 filed Apr. 19, 1977, now abandoned.

BACKGROUND OF THE INVENTION

1. Field of the Invention

This invention relates generally to semiconductor capacitors and, more particularly, to semiconductor capacitors of the electrode-insulator-semiconductor type that can be used in combination with MOS devices for fabricating circuits with the MOS devices especially useful in MOS memory circuit applications such as dynamic random access memories.

2. Description of the Prior Art

In the past, various semiconductor capacitor structures have been developed in attempts to improve the ability of the capacitor structure to have greater reliability for use or a greater charge storage ability for given size of capacitor area.

One prior attempt to increase the capacitance of a semiconductor capacitor structure was to develop a sub-surface convoluted semiconductor region by diffusion which would thereby provide a greater PN function length because of the convoluted portion and thereby increase the capacitance of the semiconductor diffused capacitor for a given area size. However, this type of semiconductor capacitor structure was costly to fabricate because it required the formation of oxide patterns in the form of a grid configuration on the surface of the semiconductor region where the diffusion operation was to be performed in for fabricating the convoluted semiconductor capacitor structure. The extra oxide paterning step was obviously more costly which resulted in the increased cost necessary to produce this prior art type of semiconductor capacitor.

Another form of semiconductor capacitor that is very popular today and is used in many circuit designs with MOS devices is the semiconductor capacitor described in U.S. Pat. No. 3,519,897 that is assigned to the same assignee of this patent application. This particular semiconductor capacitor structure is very reliable due to the use of an inversion preventing highly doped barrier region around the semiconductor portion that serves as one plate of the capacitor structure. The reason for this highly doped barrier region around the capacitor's semiconductor region or plate is to provide a method for delimiting the inversion area around this semiconductor region and to prohibit any unintentional and undesired expansion of the inversion region caused by a potential source being applied to the electrode or plate on the dielectric layer located on a surface of the semiconductor region.

As the technology has developed and advanced, the demand has increased for developing new semiconductor capacitor structures that would not require fairly precise alignments, as is required in the above cited patent, where the electrode plate needs to be positioned and spaced so that the plates edges are within the diffused barrier region. Additionally, there was a need to develop a new type of semiconductor capacitor that would use doped regions within a substrate for creating both a high capacitance value and a reliable capacitor structure that could be used with an MOS device for various types of applications especially for use in a single device MOS memory cell to be used in dynamic random access memories.

Because of the need to minimize use of silicon real estate, it is important that the semiconductor capacitor structure would have a higher capacitance for a given area than previous semiconductor capacitor designs. It was also necessary to provide a semiconductor capacitor structure that could be used with the faster N channel MOS type devices which requires that the new semiconductor capacitor design be able to work well in a substrate of P− type conductivity.

Thus, there was a need to provide an improved semiconductor capacitor structure that would solve the above identified problems associated with prior semiconductor capacitor structures and would be compatible for integrated use with N channel MOS devices in single device random access memory cell designs.

BRIEF DESCRIPTION OF THE DRAWING

FIG. 1 is a series of Steps A through J showing elevational views, in cross section, of the successive steps of manufacture of an improved semiconductor capacitor device in accordance with one embodiment of this invention.

FIG. 2 is a top view of the semiconductor capacitor device of FIG. 1 showing the doped regions in dotted line configuration and both the larger capacitor plate electrode and the metal contact to the doped region underneath the capacitor plate electrode.

FIG. 3 is a view similar to FIG. 1 showing the Steps A through K for making an integrated MOS device and semiconductor capacitor structure which are electrically connected together by means of the drain (or source) region of the MOS device being in contact with the doped semiconductor portion of the semiconductor capacitor device.

FIG. 4 is a view showing the diffusion and implanted region profiles of the integrated semiconductor structure of FIG. 3 using the abscissa (or X axis) to depict the junction depth in microns into the semiconductor structure from the surface thereof and the ordinate (or Y axis) representing the concentration of impurities for the different doped regions of the integrated semiconductor structure.

SUMMARY OF THE INVENTION

In accordance with one embodiment of this invention, it is an object of this invention to provide an improved semiconductor capacitor device.

It is another object of this invention to provide a method for fabricating an improved semiconductor capacitor device.

It is still a further object of this invention to provide an integrated semiconductor structure having an MOS device and a semiconductor capacitor device for use in MOS type circuits.

It is stil another object of this invention to provide a method for producing an integrated semiconductor structure having an MOS device and a semiconductor capacitor device.

DESCRIPTION OF THE PREFERRED EMBODIMENTS

In accordance with one embodiment of this invention, a semiconductor capacitor device is disclosed which comprises a first semiconductor region of one conductivity type having a high resistivity which is preferably a starting semiconductor substrate of, for example, P− type conductivity. A second semiconductor region of the same one conductivity type is located within a portion of the first semiconductor region extending inwardly from one surface therof and this second semiconductor region has a lower resistivity than the resistivity of the first semiconductor region. A region of opposite conductivity type is located within the second semiconductor region and has a lower resistivity than the resistivity of the second semiconductor region. An insulating layer is located on the one surface and is in contact with the first and second regions of the same one conductivity type and the region of opposite conductivity type. An electrically conductive electrode (preferably doped polysilicon) is disposed on a portion of the insulating layer and is located over the region of opposite conductivity type. Contact means are connected to the region of opposite conductivity type for electrically contacting this region of opposite conductivity type. The semiconductor capacitor device thus uses the electrically conductive electrode as one plate of the semiconductor capacitor device, the insulating layer as the dielectric of the semiconductor capacitor device, and the region of opposite conductivity type being the other plate of the semiconductor capacitor device.

In accordance with another embodiment of this invention, an integrated semiconductor structure is disclosed which comprises a semiconductor substrate. An MOS device and a semiconductor capacitor device are located within a portion of the semiconductor substrate. The MOS device has a source region and a drain region. The MOS device also has an insulating layer located on one surface thereof and gate electrode means disposed on the insulating layer located over a portion of the semiconductor substrate between the source region and the drain region for controlling the formation of a channel between the source region and the drain region. The semiconductor capacitor device comprises a semiconductor region of the same type conductivity as the semiconductor substrate and this region has a lower resistivity than the resistivity of the semiconductor substrate. A semiconductor region of opposite conductivity type is located within the semiconductor region that is of the same type conductivity as the semiconductor substrate and has a lower resistivity than the resistivity of the semiconductor region of the same type conductivity as the substrate. The insulating layer is also located on a surface of the semiconductor region of opposite conductivity type and on a surface of the semiconductor region of the same type conductivity as the semiconductor substrate. An electrically conductive electrode is disposed on a portion of the insulating layer located over the region of opposite conductivity type. Contact means are provided for electrically contacting a number of the active semiconductor regions of the MOS device and the semiconductor capacitor device. The electrically conductive electrode is one plate of the semiconductor capacitor device, the portion of said insulating layer located over the region of opposite conductivity type is the dielectric of the semiconductor capacitor device, and the region of opposite conductivity type being the other plate of the semiconductor capacitor device.

In accordance with still another embodiment of this invention, a method is disclosed for making a semiconductor capacitor device wherein a semiconductor region of one conductivity type is formed within a higher resistivity semiconductor region of the same type conductivity. A shallow semiconductor region of opposite conductivity type is formed within the semiconductor region of one conductivity type that is located within the higher resistivity semiconductor region of the same one type conductivity. An insulating layer is formed on a surface of the semiconductor region of one conductivity type, the higher resistivity semiconductor region of the same one type conductivity, and the shallow semiconductor region of opposite conductivity type. An electrically conductive electrode is formed on a surface portion of the insulating layer located over the shallow semiconductor region of opposite conductivity type. An electrical contact is formed to make an electrical connection to the shallow semiconductor region of opposite conductivity type. The electrically conductive electrode forms one plate of the semiconductor capacitor device, the insulating layer is the dielectric of the semiconductor capacitor device, and the semiconductor region of opposite conductivity type is the other plate of the semiconductor capacitor device.

In accordance with a still further embodiment of this invention, a method is disclosed for making an integrated semiconductor structure having an MOS semiconductor device and a semiconductor capacitor. A semiconductor region of one conductivity type is formed within a higher resistivity, semiconductor substrate region of the same type conductivity. A shallow semiconductor region of opposite conductivity type is formed within the semiconductor region of one conductivity type that is located within the higher resistivity semiconductor substrate region of the same one type conductivity. An insulating layer is formed on a surface of the semiconductor region of one conductivity type, the higher resistivity semiconductor substrate region of the same one type conductivity, and the shallow semiconductor region of opposite conductivity type. Speed polysilicon layer portions are formed on the surface of the insulating layer over the shallow semiconductor region of opposite conductivity type, and over a portion of the higher resistivity semiconductor substrate region of the same one type conductivity that is spaced from the shallow semiconductor region of opposite conductivity type in order to be used as a self-alighed polysilicon gate electrode for the MOS semiconductor device. Openings are formed in the insulating layer subsequently forming on opposite sides of the polysilicon gate electrode layer portion for source and drain regions. Source and drain regions are formed for the MOS semiconductor device on opposite sides of the polysilicon gate electrode layer portion using the polysilicon gate electrode layer portion as a self-aligned mask which is doped during the process of forming the source and drain regions along with the polysilicon layer portion located over the shallow semiconductor region of opposite conductivity type to render both polysilicon layer portions electrically conductive. Electrical contacts are formed to a number of the active semiconductor regions of the MOS semiconductor device and the semiconductor capacitor device. The electrically conductive polysilicon layer portion located over the shallow semiconductor region of opposite conductivity type serves as one plate of the semiconductor capacitor device. The portion of the insulating layer that is located over the region of opposite conductivity type is the dielectric of the semiconductor capacitor device. The region of opposite conductivity type is the other plate of the semiconductor capacitor device.

The foregoing and other objects, features, and advantages of the invention will be apparent from the following more particular description of the preferred embodiments of the invention as illustrated in the accompanying drawings.

THE SPECIFICATION

Referring to FIG. 1, Step A depicts a starting semiconductor substrate 10 of P— type semiconductor (preferably silicon) material. The semiconductor starting substrate 10 may be obtained from commercial semiconductor wafer fabrication sources or grown as a bar from a suitably P doped melt by conventional crystal growth techniques and then sliced into wafers or substrates. Preferably, the P type impurities used in the P— type substrate 10 have an impurity concentration of about $10^{15}$ impurities per cubic centimeter. The P type impurities used can be a P type dopant such as boron. The thickness of the starting P— substrate 10 can be the same as the thickness of conventional semiconductor wafers. It should be understood that what is described in the sequence Steps of FIG. 1 and FIG. 3 relate to the process steps that would produce a single device or an integrated semiconductor structure within a single die or chip which would be diced away from a large wafer (the rest of which is not shown). If desired, regions and devices containing regions of opposite type conductivity can be used from that shown and described herein.

Referring to Step B of FIG. 1, a silicon dioxide layer 12 is formed or deposited on a surface of the P— type substrate 10 such as by conventional thermal oxide growth techniques. Alternatively, if desired, pyrolitic deposition techniques can be used to deposit a silicon dioxide layer on the surface of the P— substrate 10.

Referring to Step C of FIG. 1, a photoresist pattern 14 is formed on the surface of the silicon dioxide layer 12 by conventional photolithographic photoresist formation, exposure, development and removal techniques. Thus, an opening is formed in the photoresist layer 14 as shown in Step C of FIG. 1.

Referring to Step D of FIG. 1, by using the photoresist layer 14 as a mask, an opening is formed in the thermally grown silicon dioxide layer 12 by using a conventional oxide etchant. This opening exposes a portion of the semiconductor surface in order to permit an ion implantation operation to be performed therein to implant Boron impurities, as generally designated by numeral 16, into the P— substrate 10 in order to form P type region 18. This P type region 18 has a surface impurity concentration of about $2 \times 10^{16}$ impurities per cubic centimeter after all heating operations have been completed. This region 18 has a penetration depth of about 2 microns after all of the heating process steps have been performed in making the semiconductor capacitor device structure.

Referring to Step E of FIG. 1, a regrown silicon dioxide layer 12A is formed on the upper surface of the semiconductor substrate 10 and over its P type Boron implanted region 18. As shown in the drawing of Step E, the portion of the silicon dioxide layer 12A that is located above the P type region 18 has a recess 20 which is caused by the fact that the silicon dioxide layer 12 that is regrown or formed on the remaining surface portion of the semiconductor substrate 10 is thicker then the newly formed or grown silicon dioxide portion that is thermally grown over the P type region 18 which previously did not have a silicon dioxide layer thereon. This recessed portion is an important visual indentification feature in the process of fabricating the semiconductor capacitor device of this embodiment since it permits visual identification of the areas where the semiconductor capacitor structure is to be located or formed.

Referring to Step F of FIG. 1, by conventional photolithographic masking and etching techniques using a photoresist pattern (not shown) an opening is formed in the surface of the silicon dioxide layer 12A which is smaller than and within the area of the previous opening that was formed in the silicon dioxide layer 12 (see Step D of FIG. 1). A second ion implantation step is carried out at this point in the process as designated by reference numeral 22 to implant Arsenic impurities into the P type region 18 in order to form a very shallow N type region 24 as shown in Step F of FIG. 1.

Referring to Step G of FIG. 1, another silicon dioxide regrowth process is carried out in order to form a regrown silicon dioxide layer 12B on the surface of the semiconductor substrate 10 which now includes the P type region 18 and the N type region 24. The N type region 24 has an impurity concentration of 2 to 5 times $10^{17}$ impurities per cubic centimeter and has a junction depth of only 0.5 microns. The regrown silicon dioxide layer 12B also has a recessed portion over the N type region 24 which is useful for subsequent processing operations because it permits a visual identification of the location of the subsurface N type region 24. There are instances where the formation of this processed oxide portions can be eliminated.

Referring to Step H of FIG. 1, an electrode layer 26 which can be made of metal such as aluminum, but is preferably made of polycrystalline silicon material is deposited onto the insulating or silicon dioxide layer 12B. As can be seen with reference to the drawing of Step H, the deposited polysilicon layer 26 has a recess formed therein due to the recess formed in the silicon dioxide layer 12B. This recessed portion of the polysilicon layer 26 is useful for a subsequent photolithographic masking and etching operation which is carried out in Step I.

Referring to Step I of FIG. 1, a photolithographic masking and etching operation is carried out to remove all of the polysilicon layer 26 except the portion of the polysilicon layer 26 that remains over the N type region 24 and subsequently serves as the outer electrode plate of the semiconductor capacitor device. As can be seen again from this drawing, the portion of the polysilicon layer 26 that remains is located on the recessed portion of the silicon dioxide layer 12B and this portion of the polysilicon electrode layer 26 is smaller in size than the underlying N type region 24 which is separated and spaced from the polysilicon electrode layer 26 by the insulating or silicon dioxide layer 12B. The polysilicon electrode layer 26 is doped by carrying out a diffusion operation with dopants of P or N type conductivity to render the polysilicon electrode layer conductive so that it can carry current and function as one plate of a capacitor structure.

Thus, it is evident that the polysilicon electrode layer 26 can be formed in a manner that permits more case in manufacturing due to the identification of the recessed portion of the silicon dioxide layer 12B that is located over the N type region 24. Furthermore, there is no need to have a fairly precise overlapping electrode or plate configuration as is shown in U.S. Pat. No. 3,519,897 which require that the edges of the electrode or plate be over the surrounding diffused barrier region.

Thus, one advantage of this semiconductor capacitor structure is that the capacitor electrode 26 need not entirely cover the underlying N region 24.

Referring to Step J of FIG. 1, an overlying silicon dioxide layer 28 is deposited, preferably by pyrolitic deposition techniques, to form an encapsulating insulating layer over the entire surface of the semiconductor structure that contains the doped polysilicon electrode 26.

Referring to FIG. 2, the overlying silicon dioxide layer 28 has been removed in a top view showing the diffusion pattern and the electrode structure and metal contact needed to provide the semiconductor capacitor of this embodiment. This figure is a top view of Step J of FIG. 1.

The doped polysilicon electrode 26 is shown in solid line form. As shown, the doped polysilicon electrode 26 is located over the N type region 24 which is shown in dotted form as being beneath and surrounding the doped polysilicon electrode 26. The P type region 18 is also shown surrounding the N type region 24 and, due to its higher concentration of P type dopants than the P− substrate 10, serves to overcome N type surface inversion effects from the overlying silicon dioxide layer. An extension portion 30 of the N type region 24 extends out from the N type region 24 and is of the same type conductivity and is formed during the same ion implantation process. This extension portion 30 permits an electrical connection to be made to the N type region 24 at the extension portion 30 by means of a metal electrode 32. This is done by conventional photolithographic oxide masking and etching techniques wherein an opening is formed in the pyrolitically deposited silicon dioxide layer 28 and through the underlying silicon dioxide layer 12B to form a contact opening to the surface portion of the N type region 24 in the extension portion 30. Subsequently, a separate metal deposition process is carried out to deposit metal onto the surface of the pyrolitically deposited silicon dioxide layer 28 and through the opening in the silicon dioxide layers 28 and 12B to provide an ohmic contact with the underlying N type region 24. Preferably, this metal is one of the conventional metals such as aluminum that is used for making a good ohmic contact to the N type region 24. As shown in FIG. 2, there is a corresponding extension portion 34 of the P region 18 which is formed around the extension portion 30 of the N region 24.

Referring to FIG. 3, another embodiment of this invention is shown wherein an MOS device is fabricated together with a semiconductor capacitor in a single integrated semiconductor structure.

Referring to Step A of FIG. 3, this is the same Step in the process as in Step A of FIG. 1 and shows a starting P− substrate 10C. The reference numerals used in the sequence of Steps for this FIG. 3 that corresponds to the reference numerals used in the sequence of Steps of FIG. 1 are the same with the addition of the letters C, D or E.

Thus, referring to Step B of FIG. 3, a thermally grown silicon dioxde layer 12C is grown on a surface of the P− substrate 10C.

Referring to Step C of FIG. 3, three openings are formed in the silicon dioxide layer 12C by suitably patterning the photoresist layer 14C and carrying out photolithographic oxide masking and etching operations. If desired, the silicon dioxide island layer portion (which is to be the gate insulator layer for the MOS device) between the left two openings in the silicon dioxide layer 12C can also be removed and another gate oxide layer can be regrown to any desired thickness. The use and function of the photoresist layer 14C will become more evident as the process is further carried out and shown by means of the various Steps of this FIG. 3. The photoresist layer 14C is reformed over the semiconductor structure surface after the three openings have been formed in the silicon dixode layer 12C. Thus, this reformed photoresist layer 14C is shown to have two recesses in the two oxide opening areas located on the left side portion of the surface of the substrate 10C. These two recessed portions in the reformed photoresist layer 14C serve to identify the location of subsequent source and drain diffusion operations which are to be performed later in the process (see Step I). However, photoresist layer 14C also functions to provide an ion implantation barrier layer to prevent the source and drain designated areas of the semiconductor substrate 10C from being bombarded by the ion implantation process operations which follow.

Referring to Step D of FIG. 3, a Boron type implant operation is carried out similar to the Boron type implant operation that is shown in Step D of FIG. 1.

Referring to Step E of FIG. 3, after photoresist removal and an oxide regrowth operation is carried out (as shown in Step E of FIG. 1), the silicon dioxide layer 12C is regrown over the semiconductor substrate surface which is then selectively photolithographically masked and oxide etched to remove a portion of the oxide layer 12C using another reformed and repatterned photoresist layer 14C to provide a smaller opening in the silicon dioxide layer 12C than previously existed in Step D. Now the semiconductor substrate 10C with its Boron ion implanted region 18C is ready for an Arsenic ion implantation step which is similar to the Arsenic ion implantation step shown in Step F of FIG. 1.

Referring to Step F of FIG. 3, an oxide regrowth process is carried out to reform a thicker silicon dioxide layer 12D over the top surface of the semiconductor substrate 10C including its implanted regions 18C and 24C and thereby form an insulating layer over the entire top surface of the semiconductor structure.

As can be seen with reference to this Step of FIG. 3, the silicon dioxide layer 12D also has recessed portions to correspond to the thinner oxide layer portions that are formed where there was no previous oxide layer (due to openings formed in the oxide layer). At this Step in the process, a polysilicon electrode layer 26C is deposited on the surface of the silicon dioxde regrown layer 12D. As can be seen, the polysilicon layer 26C takes on the pattern of the underlying silicon dioxide layer 12D and has corresponding recesses as shown in Step F of this Figure.

In Step G of FIG. 3, a photolithographic masking and etching operation is carried out using a photoresist pattern (not shown) to etch away portions of the polysilicon electrode layer 26C to leave two spaced polysilicon electrode portions 26D and 26E. The polysilicon electrode portion 26D serves as the gate electrode for the MOS device and the other polysilicon electrode portion 26E is a capacitor electrode plate for the semiconductor capacitor. The two recessed portions on opposite sides of the polysilicon gate electrode 26D are the designated areas in silicon dioxide layer 26D to identify where openings will be formed for the formation of source and drain regions of the MOS device.

Referring to Step H of FIG. 3, a photolithographic oxide masking and etching operation using a photoresist pattern (not shown) is carried out to etch openings 25C and 27C on opposite sides of the polysilicon gate electrode portion 26D which is the first operation in forming the source and drain regions using the self-aligned gate electrode 26D.

Referring to Step I of FIG. 3, a conventional phosphorous diffusion operation is carried out to form an N+ source region 29C and an N+ drain region 31C on opposite sides of the polysilicon gate electrode portion 26D. At the same time, both the polysilicon gate electrode portion 26D and the polysilicon capacitor electrode 26E are doped with phosphorous and thus become electrically conductive. From this Step of FIG. 3 it can be seen that the drain region 31C (which, if desired can be the source region of the MOS device) is formed into the N Arsenic region 24C to thereby permit the drain region to be electrically connected to the N semiconductor portion of the semiconductor capacitor device of this integrated semiconductor structure.

The semiconductor diffused source and drain regions 29C and 31C forming the source and drain regions of the MOS device and not formed as deep as the Boron implanted region 18C. The reason that the N+ diffused region formed in the P− substrate is used for only the source and drain regions and not used as the semiconductor implanted region for the semiconductor capacitor device is that the N+ diffused phosphorous regions generally form a very distorted PN junction which causes a great deal of current leaking and thus substantially affects the electrical characteristics of a semiconductor capacitor region formed by a phosphorous diffusion. Whereas, on the other hand, the shallow Arsenic implanted region 24C has a well defined (non leaky) junction and also does not penetrate very deeply into the silicon substrate surface thereby making it a very good region for a semiconductor capacitor. Furthermore, since Arsenic is a well known slow diffusant as compared to phosphorous, subsequent heat treatment steps will have less effect on the Arsenic region 24C penetrating into the substrate than it would on the N+ regions formed by a phosphorous diffusion.

Referring to Step J of FIG. 3, a silicon dioxide layer 28C is deposited over the entire upper surface of the integrated semiconductor structure. The function of the silicon dioxide layer 28C, which is pyrolitically deposited similar to the manner that the corresponding layer 28 is deposited in Step J of FIG. 1, is to effectively encapsulate and protect or insulate the entire integrated semiconductor structure surface including the polycrystalline silicon gate electrode portion 26D and the capacitor polycrystalline silicon plate 26E. Thus, a very good electrical insulation layer is provided over both of these electrodes or plates.

Referring to step K of FIG. 3, by means of photolithographic oxide masking and etching techniques, openings are formed in the deposited silicon dioxide layer 28C in order to provide access or openings to the diffused source and drain regions 29C and 31C. By means of a conventional metal evaporation or deposition process, metal, such as aluminum, is deposited onto the surface of the integrated semiconductor structure and, by means of photolithographic metal masking and etching techniques, the metal that is deposited is patterned to form ohmic contact electrode 33C to the source region 29C and ohmic contact electrode 35C to the drain region 31C.

Step K of FIG. 3 depicts the completed combined MOS device and semiconductor capacitor device all in one integrated structure with the MOS device electrically connected to the semiconductor portion of the semiconductor capacitor in order to provide a combined MOS-capacitor structure which is useful in making a one device, random access memory cell.

Referring to FIG. 4, this is a graph showing the junction depth as the abscissa and the concentration of impurities as the ordinate for the various regions of the MOS device and the semiconductor capacitor of FIG. 3. In one embodiment, the Arsenic region 24C had a junction depth of 0.5 microns and an impurity concentration of 2 to 5 times $10^{17}$ impurities per cubic centimeter whereas the penetration depth of the Boron region 18C had a depth of about 2 microns and an impurity concentration of approximately 2 times $10^{16}$ impurities per cubic centimeter. The phosphorous junction depth was about 1 micron and its impurity concentration was on the order of about $10^{20}$ impurities per cubic centimeter. The important relationship that is shown in this Figure is that the junction point $N_{A1}$ which is the junction point between the Arsenic region 24C and the Boron region 18C is shown very close to the surface of the integrated semiconductor structure where the concentration of impurities of the graded Boron region 18C is higher than it would be for a deeper N diffused region 24C. Since the value of the capacitor of the semiconductor capacitor is proportional to the square root of the $N_{A1}$ value, then it is critical that this amount be relatively large as compared to the square root of the $N_{A2}$ value which is the junction point between the phosphorous and Boron regions. Thus, by having a shallow arsenic implanted region 24C in the integrated semiconductor structure, the capacitance for the semiconductor capacitor device is substantially increased because of the much higher $N_{A1}$ value than could be obtained by using, for example, a phosphorous diffused region as a capacitor semiconductor electrode in the semiconductor structure. Furthermore, the Boron implanted region 18C has a substantially high concentration (Co) of impurities at its surface portion especially in the region surrounding the arsenic region 24C at all points except where the phosphorus region 31C intersects into the arsenic region 24C. The purpose of this Boron doped region 18C which has a higher surface concentration of P type impurities because of the natural graded values of implanted regions is to prevent an inversion of the surface around the Arsenic region 24C beneath the inversion causing silicon dioxide layer.

Portions of the graph of FIG. 4 are applicable to the capacitor device of FIG. 1 and the operation of the capacitor of FIG. 1 with its Arsenic and Boron implanted regions would be the same as explained for FIG. 3 using the graph of FIG. 4. If desired, diffused regions can be used instead of the ion implanted regions; however, better junctions and hence a better semiconductor capacitor can be made with ion implanted regions as described above.

While the invention has been particularly shown and described with reference to the preferred embodiments above, it will be understood by those skilled in the art that the foregoing and other changes in the form and details may be made therein without departing from the spirit and scope of the invention.

What is claimed is:

1. A method for making a semiconductor capacitor device comprising the steps of:

forming a semiconductor region of one conductivity type within a higher resistivity semiconductor region of the same type conductivity;

forming a shallow semiconductor region of opposite conductivity type within said semiconductor region of one conductivity type located within said higher resistivity semiconductor region of the same one type conductivity;

forming an insulating layer on a surface of said semiconductor region of one conductivity type, said higher resistivity semiconductor region of the same one type conductivity and said shallow semiconductor region of opposite conductivity type;

forming an electrically conductive electrode on a surface portion of said insulating layer located over said shallow semiconductor region of opposite conductivity type, said electrode being contoured to have an area that covers a major portion of the area of said shallow semiconductor region of opposite conductivity type; and depositing an electrical contact to make an electrical connection to said shallow semiconductor region of opposite conductivity type, said electrically conductive electrode being one plate of the semiconductor capacitor device, said insulating layer being the dielectric of the semiconductor capacitor device, and said semiconductor region of opposite conductivity type being the other plate of the semiconductor capacitor device.

2. A method in accordance with claim 1 wherein said step of forming said semiconductor region of one conductivity type within a higher resistivity semiconductor region of the same type conductivity comprising ion implanting impurities of said one conductivity type into said higher resistivity semiconductor region of said one conductivity type.

3. A method in accordance with claim 1 wherein said step of forming said shallow semiconductor region of opposite conductivity type comprising ion implanting impurities of said opposite conductivity type into said semiconductor region of one conductivity type located within said higher resistivity semiconductor region of said one conductivity type.

4. A method in accordance with claim 2 wherein said step of forming said shallow semiconductor region of opposite conductivity type comprising ion implanting impurities of said opposite conductivity type into said semiconductor region of one conductivity type located within said higher resistivity semiconductor region of said one conductivity type.

5. A method in accordance with claim 2 wherein said ion implanted impurities being boron ions.

6. A method in accordance with claim 3 wherein said ion implanted impurities being arsenic ions.

7. A method in accordance with claim 4 wherein said ion implanted impurities forming said semiconductor region of one conductivity type being boron ions, said ion implanted impurities forming said shallow semiconductor region of opposite conductivity type being arsenic ions.

8. A method in accordance with claim 1 wherein said step of forming said insulating layer comprising thermally growing a silicon dioxide layer.

9. A method in accordance with claim 1 wherein said step of forming said electrically conductive electrode comprising depositing a polysilicon layer on said insulating layer, doping said deposited polysilicon layer to make it electrically conductive, and removing portions of said doped polysilicon layer to form said electrically conductive electrode on the surface portion of said insulating layer located over said shallow semiconductor region of opposite conductivity type.

10. A method in accordance with claim 1 wherein said step of depositing an electrical contact to make an electrical connection to said shallow semiconductor region of opposite conductivity type comprising evaporating a metal contact through an opening in said insulating layer to electrically contact said shallow semiconductor region of opposite conductivity type.

11. A method in accordance with claim 1 wherein said step of forming said semiconductor region of one conductivity type within a higher resistivity semiconductor region of the same type conductivity comprising ion implanting impurities of said one conductivity type into said higher resistivity semiconductor region of said one conductivity type, said step of forming said shallow semiconductor region of opposite conductivity type comprising ion implanting impurities of said opposite conductivity type into said semiconductor region of one conductivity type located within said higher resistivity semiconductor region of said one conductivity type, said ion implanted impurities forming said shallow semiconductor region of opposite conductivity type being arsenic ions, said step of forming said insulating layer comprising thermally growing a silicon dioxide layer, and said step of forming said electrically conductive electrode comprising depositing a polysilicon layer on said insulating layer, doping said deposited polysilicon layer to make it electrically conductive, and removing portions of said doped polysilicon layer to form said electrically conductive electrode on the surface portion of said insulating layer located over said shallow semiconductor region of opposite conductivity type.

12. A method for making a semiconductor capacitor device comprising the steps of:

forming a semiconductor region of one conductivity type within a higher resistivity semiconductor region of the same type conductivity;

forming a shallow semiconductor region of opposite conductivity type having at least one portion located within said semiconductor region of one conductivity type located within said higher resistivity semiconductor region of the same one type conductivity;

forming an insulating layer on a surface of said semiconductor region of one conductivity type, said higher resistivity semiconductor region of the same one type conductivity, and said shallow semiconductor region of opposite conductivity type;

forming an electrically conductive electrode on at least one surface portion of said insulating layer located over said shallow semiconductor region of opposite conductivity type; said electrode being contoured to have an area that covers a major portion of the area of said shallow semiconductor region of opposite conductivity type, and providing an electrical connection to said shallow semiconductor region of opposite conductivity type, said electrically conductive electrode being one plate of the semiconductor capacitor device, said insulating layer being the dielectric of the semiconductor capacitor device, and said semiconductor region of opposite conductivity type being the other plate of the semiconductor capacitor device.

* * * * *